US 6,635,388 B1

(12) United States Patent
Friedrich et al.

(10) Patent No.: US 6,635,388 B1
(45) Date of Patent: Oct. 21, 2003

(54) CONTACT HOLE FABRICATION WITH THE AID OF MUTUALLY CROSSING SUDDEN PHASE SHIFT EDGES OF A SINGLE PHASE SHIFT MASK

(75) Inventors: Christoph Friedrich, München (DE); Uwe Griesinger, München (DE); Rainer Pforr, Dresden (DE); Dietrich Widmann, deceased, late of Unterhaching (DE), Helga Widmann, legal representative; Andreas Grassmann, Bad Abbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/429,837

(22) Filed: Oct. 29, 1999

(30) Foreign Application Priority Data

Sep. 17, 1999 (WO) .............................. PCT/DE99/02968

(51) Int. Cl.⁷ .............................. G03F 9/00; G03C 5/00

(52) U.S. Cl. .......................................... 430/5; 430/396

(58) Field of Search ........................... 430/5, 322, 323, 430/324, 396; 378/34, 35

(56) References Cited

U.S. PATENT DOCUMENTS

| | | | | |
|---|---|---|---|---|
| 5,712,063 A | * | 1/1998 | Ahn et al. | 430/5 |
| 5,773,171 A | * | 6/1998 | Lee et al. | 430/5 |
| 5,881,125 A | * | 3/1999 | Dao | 378/35 |
| 5,897,975 A | * | 4/1999 | Ahn et al. | 430/5 |
| 5,914,204 A | * | 6/1999 | Lee | 430/5 |

* cited by examiner

Primary Examiner—Mark F. Huff
Assistant Examiner—Saleha Mohamedulla
(74) Attorney, Agent, or Firm—Laurence A. Greenberg; Werner H. Stemer; Ralph E. Locher

(57) ABSTRACT

The invention relates to a phase shift mask for lithographically producing small structures at the limit of a resolution that is predetermined by the wavelength of the exposure radiation. The phase shift mask has first regions A and second regions B that effect a phase-shift relative to the first regions. The second regions are arranged beside the first regions for producing a sudden phase shift along the boundaries between the first and the second regions. Individual first regions touch one another via corners at points, at which the second regions also touch one another via corners. The result is that the boundaries between first and second regions merge at these points and these points are opaque to the radiation. The invention makes it possible to expose extremely small contact holes with just a single exposure and thus leads to a reduction of costs in the fabrication of integrated semiconductor circuits.

11 Claims, 2 Drawing Sheets

CONTACT HOLE FABRICATION WITH THE AID OF MUTUALLY CROSSING SUDDEN PHASE SHIFT EDGES OF A SINGLE PHASE SHIFT MASK

BACKGROUND OF THE INVENTION

Field of the Invention

The invention relates to a phase shift mask or phase mask for lithographically producing small structures at the limit of a resolution predetermined by the wavelength of the radiation employed in the process. The mask has first regions and second regions, which effect phase-shifting relative to the first regions, beside the first regions for producing a sudden phase shift along boundaries between the first and the second regions.

The invention furthermore relates to a method for lithographically producing these structures, in which an object is exposed through one or more phase shift masks in such a way that lines of low radiation intensity are projected onto the object in such a way that they intersect on the object.

Phase shift masks and methods of this type are disclosed in U.S. Pat. No. 5,766,829 to Cathey, Jr., et al. The phase shift mask described therein has a multiplicity of parallel strip-type elevations. In semiconductor technology, light is projected through such so-called phase shift masks onto layers of semiconductor substrates that are to be patterned, in order to produce extremely small structures having a size in some instances below the wavelength of the radiation. The elevations are chosen with a size such that two light beams, one of which passes through the phase shift mask in the region of the elevation, have a phase difference of 180° with respect to one another. When the elevations are dimensioned within the order of the wavelength, this leads to destructive interference of transmitted radiation below the edges of the elevations. In the event of exposure through a mask with parallel strip-type elevations, parallel, unexposed strips in an otherwise exposed area are produced on the exposed area of the semiconductor substrate. If such a strip pattern is exposed onto the same area a second time, but having been rotated through a certain angle, a structure made up of isolated, unexposed points is produced on the area, whereas the intervening regions of the projected sudden phase shift edges are exposed with half the intensity and the remaining area regions are exposed with the full light intensity. Developing a resist film that has been exposed in this way produces a pattern of isolated points which is suitable for fabricating contact holes having extremely small dimensions. In the above-mentioned U.S. Pat. No. 5,766,829, the contact hole structure is produced by exposing two phase shift masks or two different regions of one phase shift mask successively onto the semiconductor substrate. Consequently, two exposure steps are always needed to produce each contact hole structure. In the mass production of integrated semiconductor circuits, on the other hand, it is an essential object for production to be as efficient and cost-saving as possible. This aim is more likely achieved, the fewer fabrication installations and the fewer process steps are needed for fabricating integrated circuits. Present day exposure apparatuses for exposing semiconductor substrates typically cost millions of dollars, which have to be realized by an appropriate throughput during operation. Modern exposure apparatuses expose approximately 60 semiconductor substrates per hour. That number is halved in the case of double exposure and accordingly entails cost disadvantages.

SUMMARY OF THE INVENTION

It is accordingly an object of the invention to provide a phase shift mask and a method with which contact holes and other extremely small structures can be fabricated, which overcomes the above-mentioned disadvantages of the heretofore-known devices and methods of this general type and which enable production without the above-mentioned cost disadvantages, that is to say with the aid of a single exposure step.

With the foregoing and other objects in view there is provided, in accordance with the invention, a phase shift mask for lithographically producing small structures at a resolution limit defined by a radiation wavelength, which comprises:

a plurality of first mask regions disposed adjacent one another and having mutually touching corners;

a plurality of second mask regions disposed adjacent one another, adjacent the first mask regions, and having mutually touching corners coinciding with the mutually touching corners of the first mask regions;

the second mask regions effecting a phase-shift relative to the first mask regions; and the mutually touching corners of the first mask regions and the mutually touching corners of the second mask regions together defining mask points at which the mask is opaque to the radiation.

For contact hole fabrication, the phase shift mask according to the invention has points which, in the azimuthal direction, are surrounded by raised and non-raised mask zones in an alternating sequence. At the edges between the raised and the non-raised regions, intensity-reducing interferences are produced on account of the sudden phase shifts and destructively interfere with one another at the point at which the zones touch one another via corners. This mask configuration enables a pattern which can only be produced in two steps to be realized on a single region of a phase shift mask. In this case, it is unimportant whether the regions which effect phase-shifting relative to the first regions are raised, recessed or a mixture of raised and recessed; all that is essential is the arrangement of the individual mask zones in such a way that they touch one another via corners in the aforementioned manner.

In accordance with an added feature of the invention, the mask points are points of intersection of boundaries between the first and second mask regions.

In accordance with an additional feature of the invention, the mask points are crossover points of boundary lines between the first and second mask regions. In a preferred embodiment, the first and second mask regions define boundary lines intersecting at right angles at the mask points.

In accordance with another feature of the invention, the second regions are raised or recessed relative to the first regions and boundaries between the first and second mask regions define sudden phase shift edges.

In other words, it is preferred for the points to be points of intersection of boundaries—in particular crossover points of boundary lines—between first and second regions. In the simplest case, a point of intersection is surrounded by four mask zones whose edge lines preferably cross at right angles. In that case, in the surroundings of the point representing the contact hole, the mask zones in the first and third quadrants may be raised relative to those in the second and fourth quadrants. Altering the mask thickness by providing raised or recessed regions is at the same time the simplest option for producing sudden phase shifts of the radiation crossing through the mask.

In accordance with a further feature of the invention, the sudden phase shift edges produce a sudden phase shift of half a wavelength. In this case, the projection of these edges leads to 50% exposure.

In accordance with again an added feature of the invention, the first and second mask regions are disposed in a chessboard pattern, i.e., in an alternating sequence. It is also possible for individual mask zones to have a rectangular or rhomboid shape. A mask of this type can be used to fabricate a multiplicity of contact holes in a simple manner.

In accordance with again another feature of the invention, the mask points are arranged in groups so closely together that they form a relatively large spot which is opaque to the radiation. This development of the invention allows fabricating extended unexposed regions. The spot which is opaque to radiation is constituted by a multiplicity of extremely small and correspondingly densely packed mask zones which touch one another via corners in the manner according to the invention. The highly compact arrangement—in comparison with the exposure wavelength—of a multiplicity of extremely small mask zones arranged in chessboard layout, leads to the radiation largely being masked out below that arrangement.

With the above and other objects in view there is also provided, in accordance with the invention, a method for lithographically producing small structures at a limit of resolution determined by the wavelength of a radiation, which comprises exposing an object through the above-described phase shift mask for a single time.

In accordance with again a further feature of the invention, lines of low radiation intensity are projected onto the object such that the lines intersect at points of intersection on the object, and the object is developed to form small structures at the points of intersection.

In a preferred embodiment, the object is a surface region of a semiconductor substrate.

In accordance with a concomitant feature of the invention, contact holes are formed at the points of intersection of the lines of low radiation intensity.

Other features which are considered as characteristic for the invention are set forth in the appended claims.

Although the invention is illustrated and described herein as embodied in a contact hole fabrication with the aid of mutually crossing sudden phase shift edges of a single phase shift mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
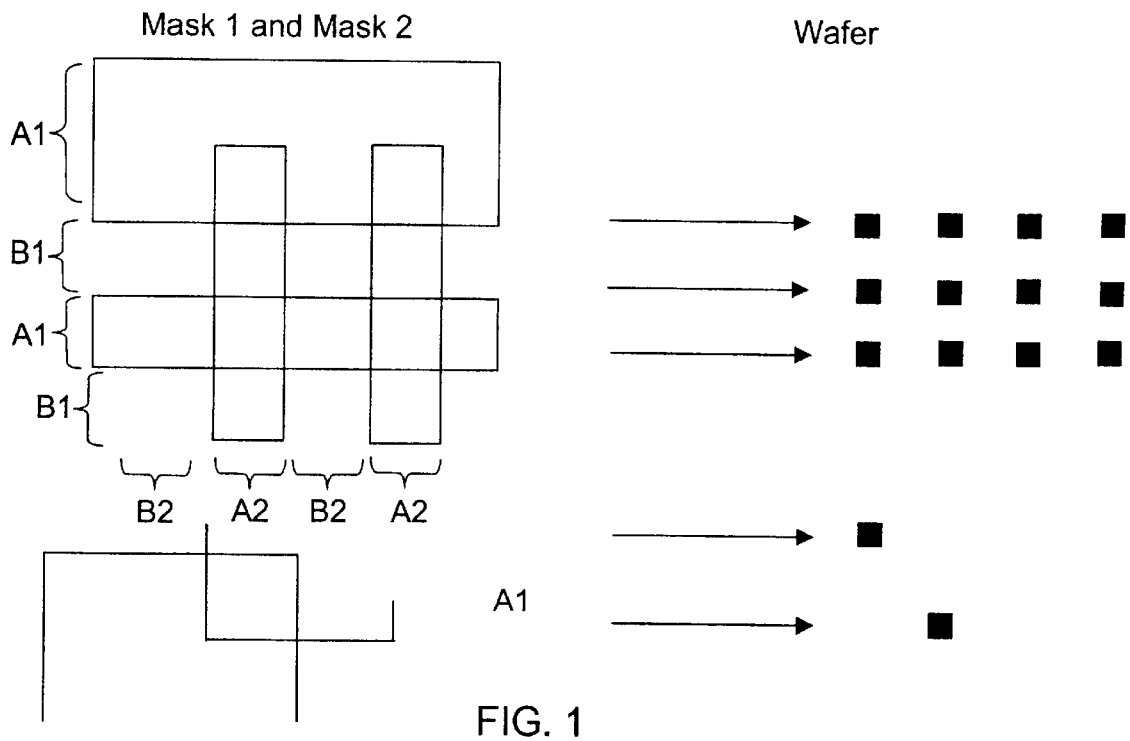
FIG. 1 is a diagrammatic view of a conventional mask system and a resulting hole pattern illustrating a process for fabricating contact hole patterns with the aid of two phase shift masks or two regions of one phase shift mask.

Referring now to the figures of the drawing in detail and first, particularly, to FIG. 1 thereof, there is seen a first mask with two horizontal strips A1. The strips A1 are raised relative to a mask surface B1 and, relative to strips B2, produce a phase shift of half a wavelength. In an analogous manner, a second mask has regions A2 which are raised relative to its mask plane B2. As a result of the successive projection of the two masks, extremely small unexposed squares are produced at the crossover points P of the edge steps between A1 and B1, and A2 and B2. The resulting squares can be used for patterning contact holes on the wafers after the mask has been developed.

Figure 2:
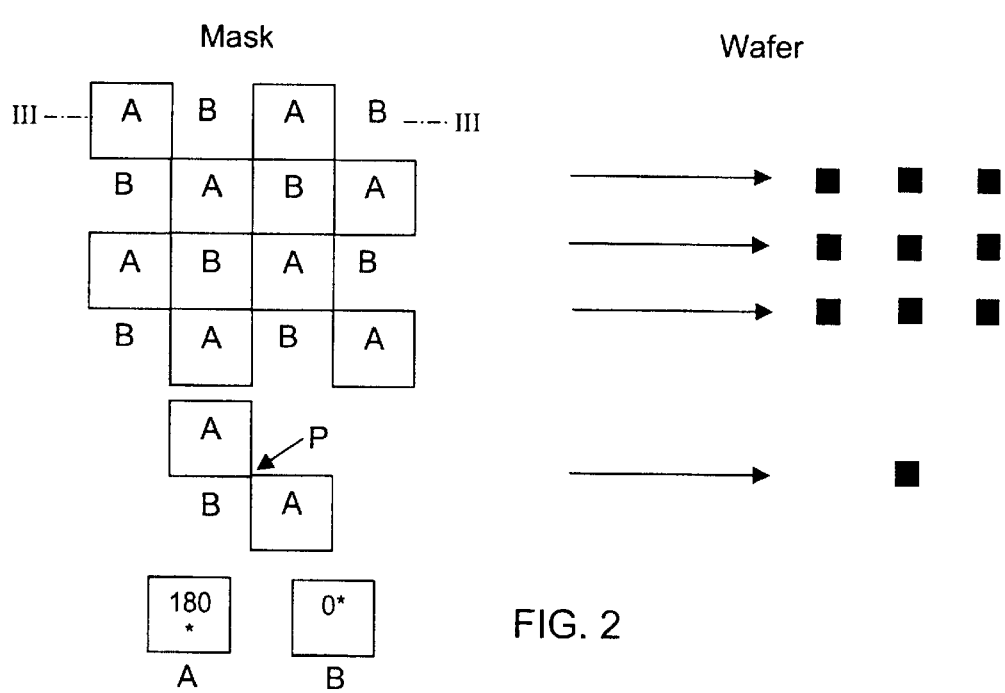
FIG. 2 shows is a diagrammatic view of a mask according to the invention and the contact hole pattern that is exposed onto the semiconductor substrate using the mask.

With reference to FIG. 2, there is shown a mask according to the invention and the contact hole pattern that is exposed onto the semiconductor substrate using that mask. The chessboard-like arrangement of raised and therefore phase-shifting mask zones A relative to mask zones B makes it possible to produce the same structure as in FIG. 1 with the aid of a single mask, that is to say with half the exposure costs.

Depending on whether a positive or negative resist is chosen, it is possible to fabricate resist pillars or resist openings with extremely small dimensions. The point-like structures produced may, for example, have a width of two thirds of the exposure wavelength.

Further embodiments of the invention in addition to those already described emerge upon application of the knowledge and abilities of a person skilled in the art. By way of example, the phase shift masks used may be glass masks whose phase-shifting regions are produced by selective etching. The lines having half the light intensity which remain between the contact hole points can be eliminated by overexposure. Provided that a sudden phase shift of 180° is produced by the mask edges, the structure size is the smallest possible given the specification of the properties of the optical imaging, such as the wavelength, the numerical aperture or the coherence. Larger structures can be produced by means of multiple lines lying close together.

Figure 3:
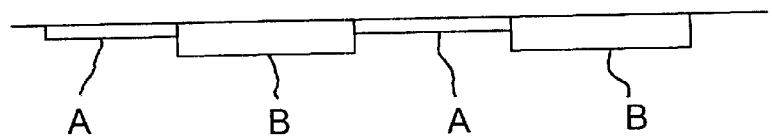
FIG. 3 is a diagrammatic sectional view of the mask pattern taken along the line III—III of FIG. 2.

With reference to FIG. 3, the mask regions A and B may have different levels, i.e. one region A may be lower or higher than and raised or recessed relative to the region B.

Figure 4:
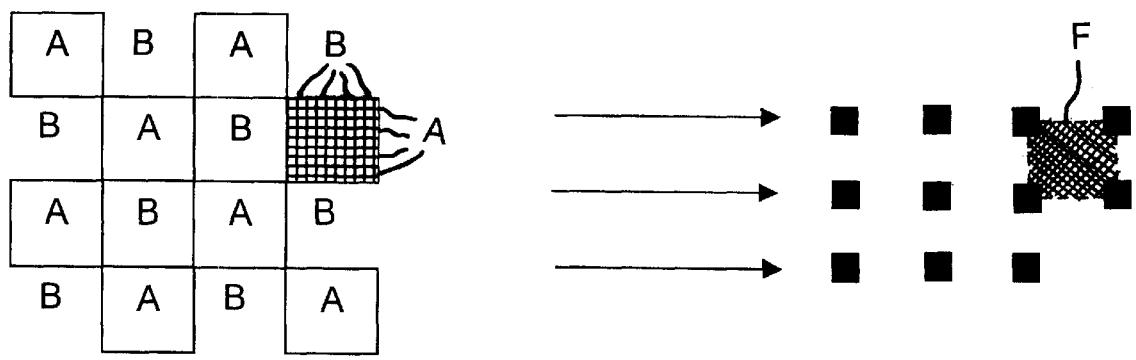
FIG. 4 is a diagrammatic view of an alternative mask pattern for producing contact holes and one much larger spot.

With reference to FIG. 4, a much larger spot can be produced on the substrate surface with a region on the mask that has the alternating fields close together. In other words, the regions B and A are spaced in a chessboard pattern in sizes that are adapted to the irradiation wavelength. The resulting "points" are thus so closely spaced that the resulting exposed area, that is to say non-irradiated area, forms a contiguous field F.

We claim:

1. A phase shift mask for lithographically producing small structures at a resolution limit defined by a radiation wavelength, which comprises:

two first mask regions disposed adjacent one another and having a mutually touching corner, there are no other first mask regions bordering said two first mask regions;

two second mask regions disposed adjacent one another, adjacent said first mask regions, and having a mutually touching corner coinciding with said mutually touching corner of said two first mask regions;

said two second mask regions effecting a phase-shift relative to said two first mask regions; and said mutually touching corner of said first mask regions and said mutually touching corner of said second mask regions together defining a mask point, the mask being opaque to the radiation only at said mask point.

2. The phase shift mask according to claim 1, wherein said mask point is a point of intersection of boundaries between said first and second mask regions.

3. The phase shift mask according to claim 1, wherein said mask point is a crossover point of boundary lines between said first and second mask regions.

4. The phase shift mask according to claim 1, wherein said first and second mask regions define boundary lines intersecting at right angles at said mask point.

5. The phase shift mask according to claim 1, wherein said two second regions are raised or recessed relative to said two first regions and boundaries between said two first and two second mask regions define sudden phase shift edges.

6. The phase shift mask according to claim 5, wherein said sudden phase shift edges produce a sudden phase shift of half a wavelength.

7. The phase shift mask according to claim 1, wherein said two first and two second mask regions are disposed in a chessboard pattern.

8. A method for lithographically producing small structures at a limit of resolution determined by the wavelength of a radiation, which comprises exposing an object through the phase shift mask according to claim 1 for a single time.

9. The method according to claim 8, which comprises projecting lines of low radiation intensity onto an object such that the lines intersect at points of intersection on the object, and developing the object to form small structures at the points of intersection.

10. The method according to claim 8, wherein the object is a surface region of a semiconductor substrate.

11. The method according to claim 8, which comprises forming contact holes at the points of intersection of the lines of low radiation intensity.

* * * * *